(12) United States Patent
Han et al.

(10) Patent No.: US 10,050,036 B2
(45) Date of Patent: Aug. 14, 2018

(54) SEMICONDUCTOR STRUCTURE HAVING COMMON GATE

(71) Applicant: Semiconductor Manufacturing International (Shanghai) Corporation, Shanghai (CN)

(72) Inventors: Qiuhua Han, Shanghai (CN); Xiaoying Meng, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/918,467

(22) Filed: Oct. 20, 2015

(65) Prior Publication Data

US 2016/0043086 A1 Feb. 11, 2016

Related U.S. Application Data

(62) Division of application No. 14/070,538, filed on Nov. 3, 2013, now Pat. No. 9,196,725.

(30) Foreign Application Priority Data

Jan. 11, 2013 (CN) .......................... 2013-10011743

(51) Int. Cl.
*H01L 29/78* (2006.01)
*H01L 27/092* (2006.01)
*H01L 29/66* (2006.01)
*H01L 21/8238* (2006.01)
*H01L 29/06* (2006.01)

(Continued)

(52) U.S. Cl.
CPC .... *H01L 27/092* (2013.01); *H01L 21/823828* (2013.01); *H01L 21/823842* (2013.01); *H01L 29/0653* (2013.01); *H01L 29/4238* (2013.01); *H01L 29/4958* (2013.01); *H01L 29/66666* (2013.01); *H01L 29/7827* (2013.01); *H01L 21/823857* (2013.01); *H01L 29/495* (2013.01); *H01L 29/4966* (2013.01); *H01L 29/517* (2013.01); *H01L 29/66545* (2013.01)

(58) Field of Classification Search
CPC ................................. H01L 29/78; H01L 29/66
USPC .......................................................... 257/330
See application file for complete search history.

(56) References Cited

U.S. PATENT DOCUMENTS

2006/0138463 A1* 6/2006 Kim ...................... H01L 27/105
257/202
2008/0135987 A1* 6/2008 Li ...................... H01L 21/82384
257/652

(Continued)

*Primary Examiner* — Dmitriy Yemelyanov
(74) *Attorney, Agent, or Firm* — Anova Law Group, PLLC

(57) ABSTRACT

Various embodiments provide a semiconductor structure having a common gate and fabrication method of the semiconductor structure. In an exemplary method, after forming a first metal gate and a second metal gate, a conductive material layer can be formed at least at the boundary between the first metal gate and the second metal gate. Thus, one end of the conductive material layer can be connected to a first metal gate electrode, and the other end of the conductive material layer can be connected to a second metal gate electrode. The resistance between the first metal gate electrode and the second metal gate electrode can be effectively reduced. Gate voltages of an NMOS transistor and a PMOS transistor of the common gate can be the same.

18 Claims, 8 Drawing Sheets

(51) Int. Cl.
*H01L 29/423* (2006.01)
*H01L 29/49* (2006.01)
*H01L 29/51* (2006.01)

(56) References Cited

U.S. PATENT DOCUMENTS

| | | | |
|---|---|---|---|
| 2008/0157215 A1* | 7/2008 | Miyashita | H01L 21/28123 257/374 |
| 2009/0057769 A1 | 3/2009 | Wei et al. | |
| 2009/0096032 A1* | 4/2009 | Saitoh | H01L 21/28097 257/369 |
| 2011/0175167 A1* | 7/2011 | Watanabe | H01L 21/28185 257/368 |
| 2012/0280328 A1* | 11/2012 | Moriyama | H01L 21/28123 257/369 |

* cited by examiner

US 10,050,036 B2

SEMICONDUCTOR STRUCTURE HAVING COMMON GATE

CROSS REFERENCE TO RELATED APPLICATIONS

This application is a divisional of U.S. patent application Ser. No. 14/070,538, filed on Nov. 30, 2013, which claims priority to Chinese Patent Application No. CN201310011743.4, filed on Jan. 11, 2013, the entire contents of all of which are incorporated herein by reference.

FIELD OF THE DISCLOSURE

The present disclosure relates to the field of semiconductor fabrication and, more particularly, relates to a semiconductor structure having a common gate and fabrication method thereof.

BACKGROUND

With development of integrated circuit (IC) manufacturing technology, critical dimension of metal-oxide-semiconductor (MOS) transistor becomes smaller and smaller. In order to reduce parasitic capacitance of a gate in a MOS transistor and improve device speed, gate stack structures having a high-K gate dielectric layer and a metal gate are introduced into the MOS transistor. In order to prevent metal material of the metal gate from affecting other structures in the transistor, the gate stack structures having a high-K gate dielectric layer and a metal gate are usually fabricated using a gate last process.

A conventional method for forming a metal gate using a gate last process may include: providing a semiconductor substrate having a dummy gate structure and an interlayer dielectric layer to cover the dummy gate structure; subjecting the interlayer dielectric layer to a chemical mechanical polishing (CMP) process using the dummy gate structure as a polish stop layer; removing the dummy gate structure to form a trench; forming a high-K gate dielectric material layer on the inner wall of the trench and on the surface of the interlayer dielectric layer, and forming a metal material layer on the surface of the high-K gate dielectric material layer and to fill the trench; and polishing the metal material layer and the high-K gate dielectric material layer using a CMP process until the interlayer dielectric layer is exposed, to form a metal gate in the trench.

Because the metal gate is fabricated after an implantation in source regions and drain regions is completed, the number of subsequent processes can be reduced. And the problem that metal materials are not suitable for high temperature treatment can be resolved.

In current circuit structures such as static random access memory and inverter, etc., usually the gate of an NMOS transistor and the gate of a PMOS transistor are electrically connected together. In order to increase the degree of process integration, a photo mask is usually designed such that an NMOS transistor and a PMOS transistor share a common gate structure. Thus, chip area can be effectively reduced and process complexity can be reduced.

For example, FIG. 1 depicts a top view of a common gate structure of an NMOS transistor and a PMOS transistor formed by conventional polysilicon gate technology. FIG. 2 depicts a cross-sectional view of the common gate structure along the direction of line AA' in FIG. 1.

The common gate structure can include: a semiconductor substrate 10 having an NMOS transistor region 01 and a PMOS transistor region 02; a common gate 11 across the NMOS transistor region 01 and the PMOS transistor region 02 having a portion of the common gate 11 located in the NMOS transistor region 01 and having another portion of the common gate 11 located in the PMOS transistor region 02; an N-type source/drain region 12 formed at both sides of the portion of common gate 11 in the NMOS transistor region 01; and a P-type source/drain region 13 formed at both sides of the other portion of common gate 11 in the PMOS transistor region 02.

With the increasing degree of chip integration, critical dimension of MOS transistor becomes smaller and smaller. Common gate of NMOS transistor and PMOS transistor also needs to use metal gate in order to reduce parasitic capacitance of the gate in the MOS transistor and increase the device speed. However, electrical resistance of the common gate formed using conventional gate last technology is undesirably high.

BRIEF SUMMARY OF THE DISCLOSURE

One aspect of present disclosure includes a method for forming a semiconductor structure having a common gate. A semiconductor substrate can be provided having a first transistor region, a second transistor region, and an isolation structure in the semiconductor substrate formed between the first transistor region and the second transistor region. A dummy gate structure can be formed on each surface of the first transistor region, the second transistor region, and the isolation structure of the semiconductor substrate. An interlayer dielectric layer can be formed on the semiconductor substrate. The interlayer dielectric layer has a top surface leveled with the dummy gate structure. A first portion of the dummy gate structure corresponding to the first transistor region can be etched to form a first trench. A first high-K gate dielectric layer can be formed on an inner wall of the first trench and a first metal gate electrode can be formed on the first high-K gate dielectric layer to form a first metal gate. A second portion of the dummy gate structure corresponding to the second transistor region can be etched to form a second trench. A second high-K gate dielectric layer can be formed on an inner wall of the second trench and a second metal gate electrode can be formed on the second high-K gate dielectric layer to form a second metal gate. The first metal gate and the second metal gate have a boundary located on the surface of the isolation structure. A third trench can be formed over the isolation structure by etching at least a portion of the first metal gate and a portion of the second metal gate at the boundary. A conductive material layer can be formed in the third trench over the isolation structure and connecting the first metal gate electrode of the first metal gate with the second metal gate electrode of the second metal gate.

Another aspect of present disclosure includes a semiconductor structure having a common gate. The semiconductor structure can include a semiconductor substrate having a first transistor region, a second transistor region, and an isolation structure in the semiconductor substrate between the first transistor region and the second transistor region. An interlayer dielectric layer can be disposed on the semiconductor substrate. The interlayer dielectric layer includes a first trench in the first transistor region and a second trench in the second transistor region. A first metal gate can be disposed in the first trench to include a first high-K gate dielectric layer disposed on an inner wall of the first trench and a first metal gate electrode disposed on the first high-K gate dielectric layer. A second metal gate can be disposed in the second trench. The second metal gate includes a second high-K gate dielectric layer disposed on an inner wall of the second trench and a second metal gate electrode disposed on the second high-K gate dielectric layer. A conductive material layer can be disposed over a surface of the isolation structure at a boundary between the first metal gate and the second metal gate to connect the first metal gate electrode of the first metal gate with the second metal gate electrode of the second metal gate.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Electrical resistance of a common gate formed using gate last technology can be undesirably high. The work functions of the metal gate of NMOS transistor and the metal gate of PMOS transistor are different. Therefore, the metal gate of NMOS transistor and the metal gate of PMOS transistor are formed with different materials and processes, and need to be separately formed.

Figure 1:
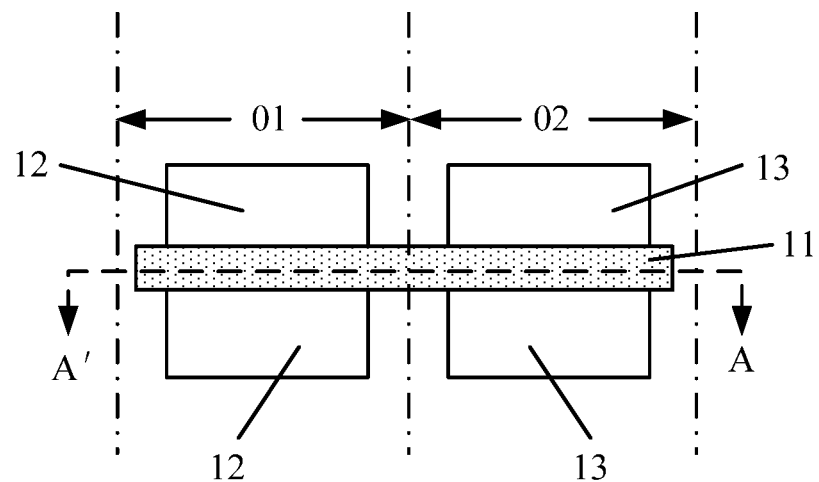
FIGS. 1-3 depict a conventional semiconductor structure having a common gate.
Figure 2:
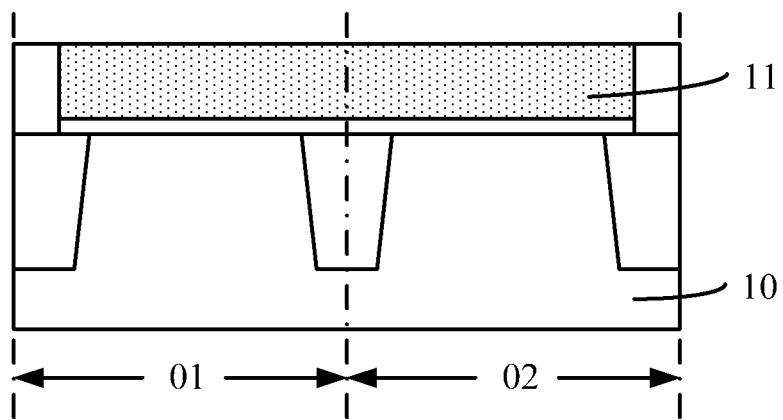
Figure 3:
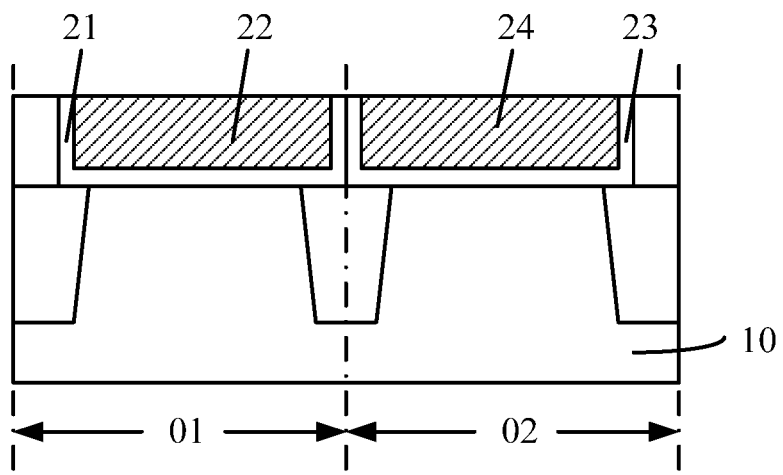

For example, referring to FIG. 3, a metal gate process for forming the common gate includes: removing a portion of the common gate 11 (e.g., as shown in FIG. 2) in the NMOS transistor region 01 using dry etching process, and forming a first metal gate for the NMOS transistor within a first trench formed by etching. The first metal gate includes a first high-K gate dielectric layer 21 formed on an inner wall of the first trench and a first metal gate electrode 22 formed on the surface of the first high-K gate dielectric layer 21.

The metal gate process for forming the common gate further includes removing the other portion of the common gate in the PMOS transistor region 02, and forming a second metal gate for the PMOS transistor within a second trench formed by etching. The second metal gate includes a second high-K gate dielectric layer 23 formed on an inner wall of the second trench and a second metal gate electrode 24 formed on the surface of the second high-K gate dielectric layer 23.

Because the first high-K gate dielectric layer 21 and the second high-K gate dielectric layer 23 exist between the first metal gate electrode 22 of the NMOS transistor and the second metal gate electrode 24 of the PMOS transistor, and the electrical resistance of the high-K gate dielectric layers is much greater than the electrical resistance of the metal gate electrodes, the electrical resistance of the common gate formed by the conventional metal gate process is high.

In addition, due to cost and process considerations, usually only one conductive plug is formed on the surface of a common gate. When a conductive plug is formed on the surface of either the first metal gate electrode or the second metal gate electrode, the gate voltage of the NMOS transistor and the gate voltage of the PMOS transistor may be different, which can cause electrical parameters of the IC device to shift, thus affecting the stability of the IC device.

Various embodiments provide a semiconductor structure having a common gate and fabrication method thereof. The method includes, for example, etching at least a portion of the first metal gate and a portion of the second metal gate at a boundary between the first metal gate and the second metal gate, to form a third trench. The method further includes forming a conductive material layer in the third trench. The conductive material layer can be used to electrically connect the first metal gate electrode of the first metal gate and the second metal gate electrode of the second metal gate. Thus, the electrical resistance between the first metal gate electrode and the second metal gate electrode can be reduced. Therefore, the gate voltage subsequently applied to the NMOS transistor and the gate voltage subsequently applied to the PMOS transistor can be substantially the same. Shifting of the electrical parameters of the IC device can thus be reduced and/or eliminated.

Figure 4:
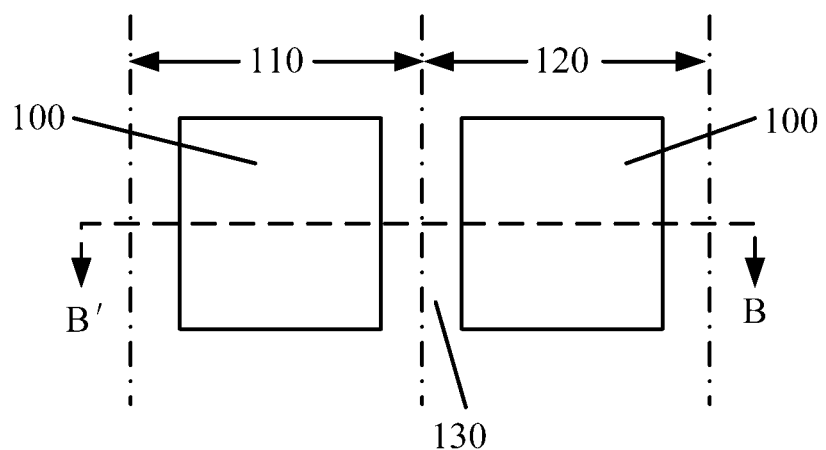
FIGS. 4-15 depict an exemplary semiconductor structure having a common gate at various stages during its formation in accordance with various disclosed embodiments.
Figure 5:
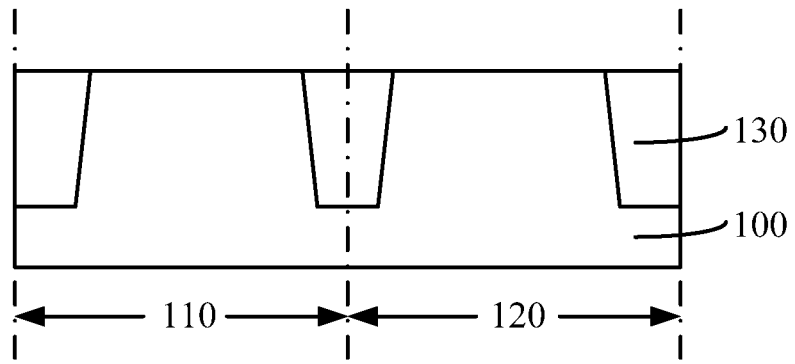

FIG. 4 depicts a top view of an exemplary semiconductor structure having a common gate during its formation in accordance with various disclosed embodiments. FIG. 5 depicts a cross-sectional view along the direction of line BB' in FIG. 4.

As shown, a semiconductor substrate 100 is provided. The semiconductor substrate 100 includes a first transistor region 110 and a second transistor region 120. An isolation structure such as an isolation structure 130 (e.g., shallow trench isolation, STI) can be formed to surround the first transistor region 110 and the second transistor region 120.

The semiconductor substrate 100 can be a substrate of silicon, germanium, silicon-germanium, silicon carbide, silicon-on-insulator, and/or germanium-on-insulator.

In some embodiments, a transistor formed corresponding to the first transistor region 110 can be a PMOS transistor, and a transistor formed corresponding to the second transistor region 120 can be an NMOS transistor. In other embodiments, a transistor formed corresponding to the first transistor region 110 can be an NMOS transistor, and a transistor formed corresponding to the second transistor region 120 can be a PMOS transistor. The NMOS transistor and the PMOS transistor can be electrically isolated by the STI structure 130.

In some embodiments, the first transistor region 110 can be adjacent to the second transistor region 120. One end of a subsequently-formed first metal gate corresponding to the first transistor region 110 and one end of a subsequently-formed second metal gate corresponding to the second transistor region 120 can be electrically connected with each other. Thus, the gate of an NMOS transistor and the gate of a PMOS transistor can be electrically connected through the electrically-connected first metal gate and second metal gate. The first metal gate and the second metal gate can thus form a common gate.

In other embodiments, there can be at least one first transistor region formed in a row on one side, and at least one second transistor region formed in a row on the other side. One end of a subsequently-formed first metal gate corresponding to the at least one first transistor region 110 and one end of a subsequently-formed second metal gate corresponding to the at least one second transistor region 120 can be in electrical connection with each other. As a result, at least the gate of one NMOS transistor and at least the gate of one PMOS transistor can be electrically connected through the electrically-connected first metal gate and second metal gate. The first metal gate and second metal gate can thus form a common gate.

Figure 6:
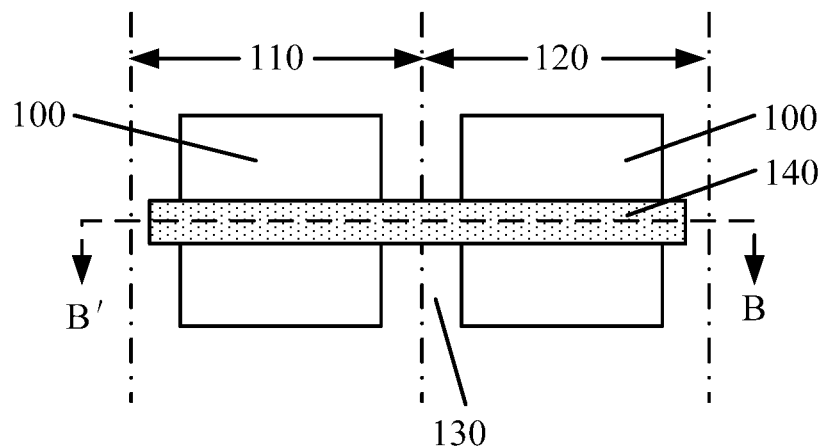
Figure 7:
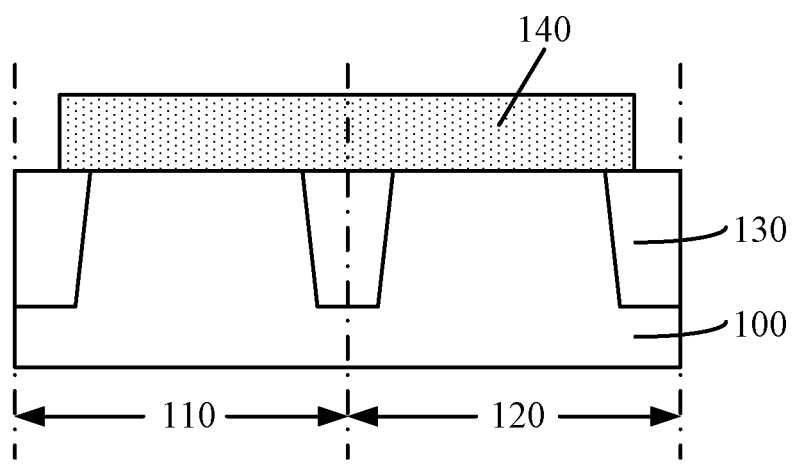

Referring to FIGS. 6-7, FIG. 6 depicts a top view of the exemplary semiconductor structure having the common gate during its formation in accordance with various disclosed embodiments. FIG. 7 depicts a cross-sectional view along the direction of line BB' in FIG. 6.

As shown, a dummy gate structure 140 is formed on the semiconductor substrate 100. The dummy gate structure 140 can simultaneously span the surface of the STI structure 130 between the first transistor region 110 and the second transistor region 120, the surface of the first transistor region 110 and the surface of the second transistor region 120.

In some embodiments, the dummy gate structure 140 can include a gate oxide layer (not shown) on the surface of the semiconductor substrate 100 and a polysilicon gate electrode (not shown) on the surface of the gate oxide layer. In one example, the process for forming the dummy gate structure 140 can include: for example, forming a silicon oxide (not shown) on the surface of the semiconductor substrate 100; forming a polysilicon material layer on the surface of the silicon oxide layer (not shown) and the STI structure 130; and etching the polysilicon material layer and the silicon oxide layer, to form the dummy gate structure 140.

The dummy gate structure 140 can be located on the surface in the middle of the first transistor region 110 and second transistor region 120, as shown in FIG. 6. The dummy gate structure 140 located on the surface of the first transistor region 110 can be subsequently removed to form the first metal gate. The dummy gate structure 140 located on the surface of the second transistor region 120 can be subsequently removed to form the second metal gate.

In other embodiments, the polysilicon gate electrode can be formed directly on the surface of the semiconductor substrate as the dummy gate structure. The polysilicon gate electrode can be removed to form the first metal gate and the second metal gate in subsequent processes.

After the dummy gate structure 140 is formed, sidewall spacers (not shown) can be formed at both sides of the dummy gate structure 140 on the surface of the first transistor region 110 and on the second transistor region 120. The sidewall spacers can be a single-layer structure or multi-layer stacking structure made of a silicon oxide layer, a silicon nitride layer, and/or a silicon oxynitride layer. The sidewall spacers can prevent subsequent ion implantation process from implanting ions into the silicon oxide layer during the formation of source regions and drain regions, which can affect the electrical properties of the finally-formed MOS transistor. The sidewall spacers can also be formed to alleviate short-channel effect.

After the sidewall spacers are formed, the source regions and the drain regions (not shown) can be formed in the semiconductor substrate 100 at both sides of the dummy gate structure 140 in the first transistor region 110 and the second transistor region 120. After the source regions and the drain regions are formed, high-temperature annealing can be used for the drive-in and activation of dopant ions in the source regions and the drain regions.

Figure 8:
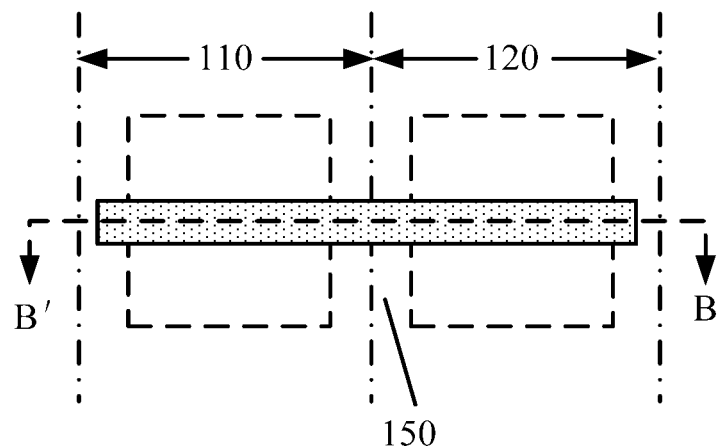
Figure 9:
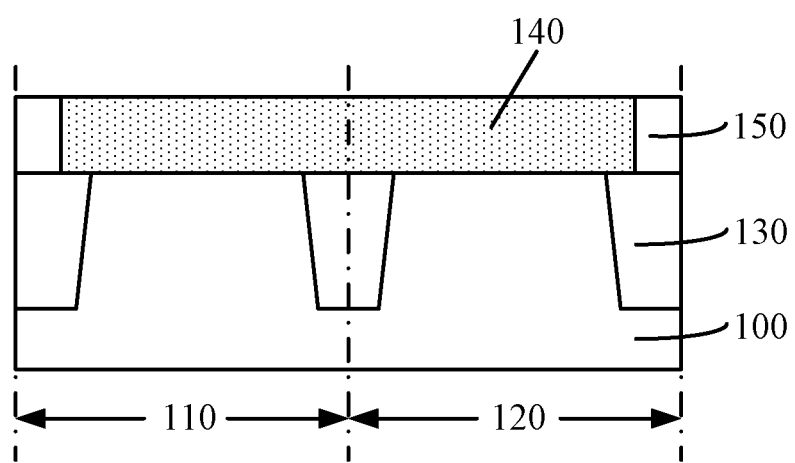

Referring to FIGS. 8-9, FIG. 8 depicts a top view of the exemplary semiconductor structure having the common gate during its formation in accordance with various disclosed embodiments. FIG. 9 depicts a cross-sectional view along the direction of line BB' in FIG. 8.

As shown, an interlayer dielectric layer 150 is formed on the surface of the semiconductor substrate 100. The top surface of the interlayer dielectric layer 150 can be leveled with the top surface of the dummy gate structure 140.

The interlayer dielectric layer 150 can be made of a material including silicon oxide, silicon nitride, tetraethyl orthosilicate (TEOS), and/or low-K dielectric material. In one example, a process for forming the interlayer dielectric layer 150 can include: forming an interlayer dielectric material on the surface of the semiconductor substrate 100, the interlayer dielectric material layer having a thickness greater than the dummy gate structure 140; and polishing the interlayer dielectric material using a CMP process until the top surface of the dummy gate structure 140 is exposed, to form the interlayer dielectric layer 150. The top surface of the interlayer dielectric layer 150 can be leveled with the top surface of the dummy gate structure 140.

FIGS. 10-15 depict cross-sectional views of the exemplary semiconductor structure having the common gate during its formation in accordance with various disclosed embodiments, along the same direction of the line BB' in FIG. 8.

Figure 10:
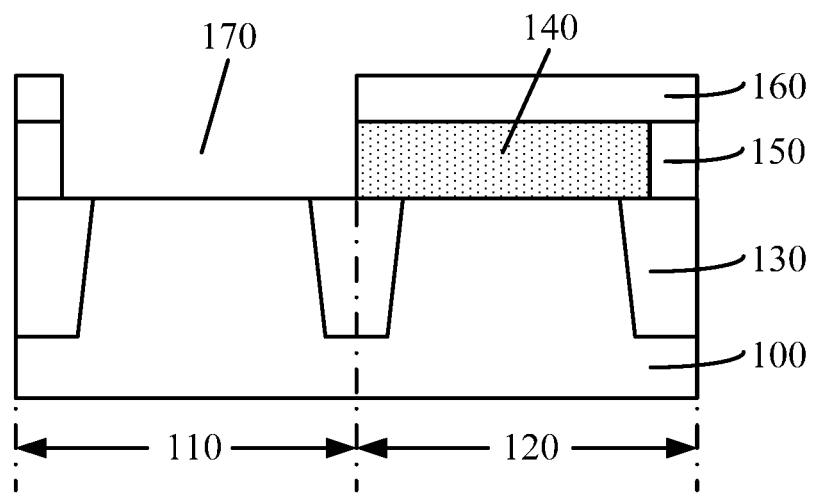

Referring to FIG. 10, a first mask layer 160 is formed on the surface of the interlayer dielectric layer 150 and on the dummy gate structure 140 corresponding to the second transistor region 120. The dummy gate structure 140 corresponding to the first transistor region 110 is removed by an etching process using the first mask layer 160 as a mask, to form a first trench 170.

The first mask layer 160 can be a single-layer structure or a multi-layer stacking structure made of a photoresist layer, a silicon nitride layer, a silicon oxide layer, and/or a silicon oxynitride layer. The first mask layer 160 can expose at least the dummy gate structure 140 corresponding to the first transistor region 110. In addition, both ends of the dummy gate structure 140 corresponding to the first transistor region 110 can be located on the STI structure 130 at both sides of the first transistor region 110. Thus, the finally-formed first metal gate can span entirely the first transistor region 110.

The dummy gate structure 140 can be etched by a wet etching process and/or a dry etching process. In one embodiment, a tetramethylammonium hydroxide (TMAH) solution can be used in a wet etching process to etch the polysilicon gate electrode of the dummy gate structure 140 and to form the first trench 170. Because the TMAH solution can have a very high etching selectivity ratio over the dummy gate structure (e.g., including polysilicon) and other materials such as silicon oxide, silicon oxynitride, or metal (which may not be etched during the wet etching). Thus there can be no damage to other semiconductor structures.

In order to prevent the etching process of polysilicon gate electrode from damaging the gate oxide layer, in some embodiments, the gate oxide layer can also be removed using an etching process. Before a first high-K gate dielectric layer is subsequently formed, a pad oxide layer can be formed on the inner wall of the first trench 170. As a result, defects in the first high-K gate dielectric layer caused by lattice mismatch between the first high-K gate dielectric layer and the semiconductor substrate 100 can be prevented.

In other embodiments, the gate oxide layer can be retained after the wet etching process (not shown) of the dummy gate electrode. Thus, the gate oxide layer can remain between the subsequently-formed first high-K gate dielectric layer and the semiconductor substrate. There can be no need to subsequent form an additional pad oxide layer between the subsequently-formed first high-K gate dielectric layer and the semiconductor substrate. Manufacturing cost and processes can be reduced. In addition, defects in the first high-K gate dielectric layer caused by lattice mismatch between the first high-K gate dielectric layer and the semiconductor substrate can be prevented. Otherwise, the defects can increase gate leakage current and reduce the anti-breakdown abilities of the first high-K gate dielectric layer. After the first trench 170 is formed, the first mask layer 160 is removed.

Figure 11:
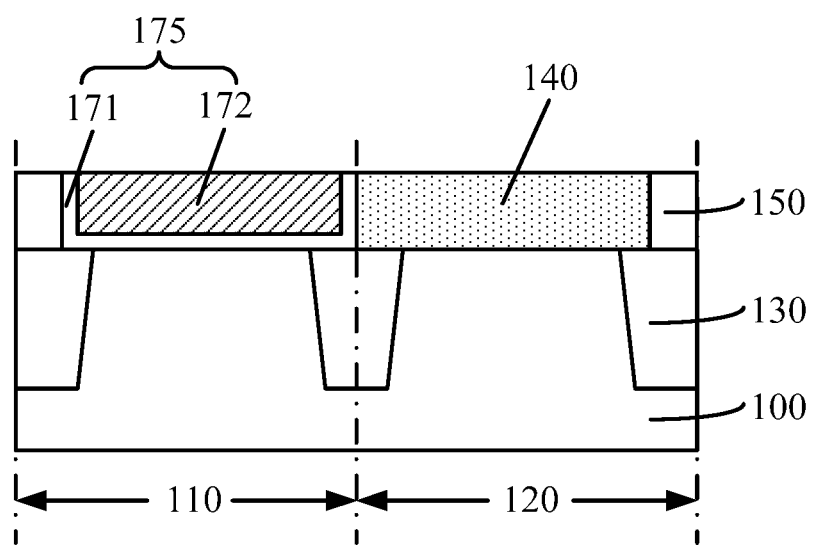

Referring to FIG. 11, a first high-K gate dielectric layer 171 is formed on the inner wall of the first trench 170, and a first metal gate electrode 172 is formed on the surface of the first high-K gate dielectric layer 171 to form a first metal gate 175.

The process for forming the first metal gate 175 can include, for example: forming a first high-K gate dielectric material (not shown) on the sidewall and bottom of the first trench 170, and on the surface of the interlayer dielectric layer 150 and the dummy gate structure 140 corresponding to the second transistor region 120; forming a first metal gate electrode material (not shown) on the surface of the first high-K gate dielectric material and to substantially completely fill the first trench 170; and polishing the first high-K gate dielectric material and the first metal gate electrode material using a CMP process, until the interlayer dielectric layer 150 is exposed, to form the first metal gate 175.

The first metal gate 175 can thus include: the first high-K gate dielectric layer 171 formed by the first high-K gate dielectric material and located on the inner wall of the first trench 170; and the first metal gate electrode 172 formed by the first metal gate electrode material and located on the first high-K gate dielectric layer 171.

In one embodiment, the first high-K gate dielectric layer 171 can be formed during the formation of the first metal gate 175, rather than during the formation of the dummy gate structure 140. Thus, damage to the first high-K gate dielectric layer 171 by the process of etching the dummy gate structure 140 can be prevented. In addition, negative effects on the first high-K gate dielectric layer 171 from high-temperature annealing process during the formation of source regions and drain regions can be avoided.

The first high-K gate dielectric layer 171 can be made of hafnium oxide, zirconium oxide, lanthanum oxide, titanium oxide, tantalum oxide, aluminum oxide, hafnium silicate, zirconium silicate, barium strontium titanium oxide, barium titanium oxide, strontium titanium oxide, or a combination thereof. The process for forming the first high K gate dielectric layer 171 can include a chemical vapor deposition process and/or an atomic layer deposition process.

In some embodiments, a pad oxide layer (not shown) can first be formed on the bottom of the first trench 170. Next, the first high-K gate dielectric layer 171 can be formed on the sidewall of the first trench 170 and the surface of the pad oxide layer (not shown). In other embodiments, the gate oxide layer may be removed in previous etching process, so the first high-K gate dielectric material layer 171 can be formed directly on the inner wall of the first trench 170.

In one embodiment, the first metal gate electrode 172 can include a multi-layer stacking structure, including: a first work function layer 172a formed on surface of the first high-K gate dielectric layer 171; and a first metal layer 172b formed on the surface of the first work function layer 172a.

The first work function layer 172a can be made of titanium, tantalum, cobalt, ruthenium, lanthanum, titanium nitride, tantalum nitride, titanium aluminum nitride, titanium-aluminum-cobalt, copper-manganese, titanium-aluminum, or a combination thereof. The material and thickness of the first work function layer 172a can be adjusted to adjust the work function of the correspondingly formed MOS transistor.

The first metal layer can be made of copper, tungsten, aluminum, silver and/or gold. The process for forming the first metal gate electrode 172 can include a physical vapor deposition process and/or an electroplating process.

Figure 12:
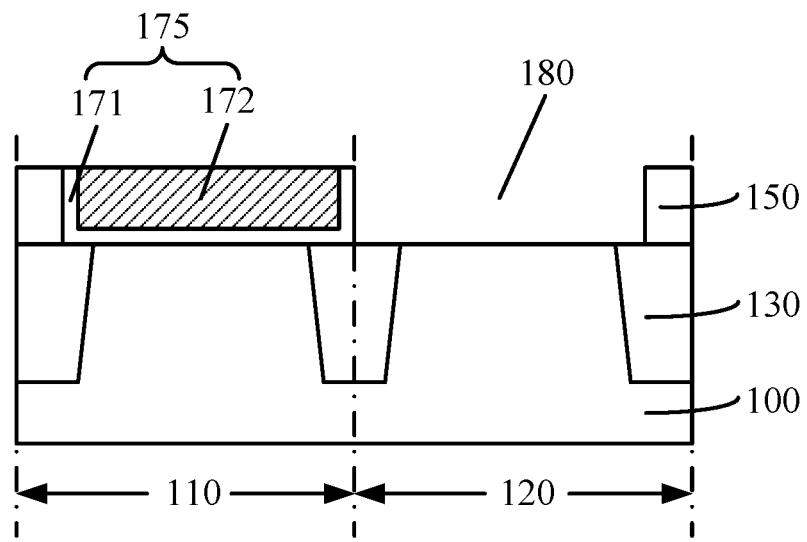

Referring to FIG. 12, the dummy gate structure 140 corresponding to the second transistor region 120 (referring to FIG. 11) is removed by an etching process to form a second trench 180. The boundary between the first trench 170 (referring to FIG. 10) and the second trench 180 is located on the surface of the STI structure 130. The process for etching the dummy gate structure 140 can include a wet etching process and/or a dry etching process, for example.

In some embodiments, the polysilicon gate electrode of the remaining dummy gate structure 140 can be removed directly using the TMAH solution for a wet etching process without using a mask. The remaining dummy gate structure 140 is the dummy gate structure 140 corresponding to the second transistor region 120. An etching process can also be used to remove the gate oxide layer. Before a second high-K gate dielectric material is subsequently formed, a pad oxide layer can be formed on the semiconductor substrate on the bottom of the second trench 180.

In other embodiments, the gate oxide layer is not removed. There can be no subsequent need to additionally form a pad oxide layer. Manufacturing cost and processes can be reduced. In addition, defects in the second high-K gate dielectric layer caused by lattice mismatch between the second high-K gate dielectric layer and the semiconductor substrate can be prevented. Otherwise, the defects can increase gate leakage current and reduce the anti-breakdown abilities of the second high-K gate dielectric layer.

Further, in other embodiments, a second mask layer can be formed on the surface of the interlayer dielectric layer 150. The second mask layer can expose the dummy gate structure 140 corresponding to the second transistor region 120. The dummy gate structure 140 corresponding to the second transistor region 120 can be etched using the second mask layer as a mask, to form the second trench. The second mask layer can be used to completely prevent effects of the etching processes on other semiconductor structures.

Because both ends of the first trench 170 are located on the surface of the STI structure 130, the boundary between the first trench 170 and the second trench 180 can be located on the surface of the STI structure 130.

Figure 13:
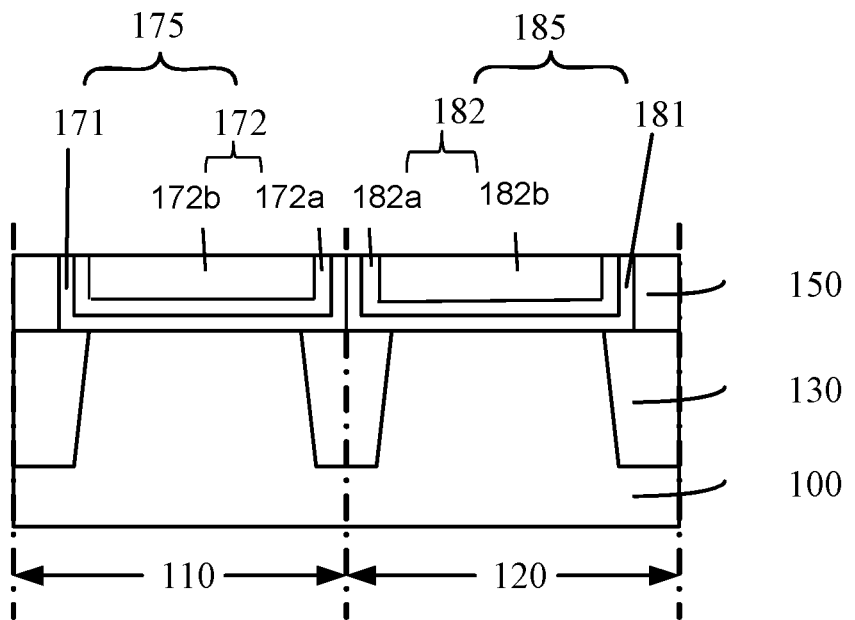

Referring to FIG. 13, a second high-K gate dielectric layer 181 is formed on the inner wall of the first trench 180 (referring to FIG. 12), and a second metal gate electrode 182 is formed on the surface of the second high-K gate dielectric layer 181 to form a second metal gate 185.

The process for forming the second metal gate 185 can include the process for forming the first metal gate 175, for example. The second metal gate 185 and the first metal gate 175 can serve as the common gate of the corresponding NMOS transistor and PMOS transistor. A conductive plug can be subsequently formed on the surface of the common gate. Thus, the gate voltages of the NMOS transistor and the PMOS transistor of the common gate can be the same.

In one embodiment, the second high-K gate dielectric layer 181 can be formed during the formation of the second metal gate 185, rather than during the formation of the dummy gate structure 140. Thus, damage to the second high-K gate dielectric layer 181 by the process of etching the dummy gate structure 140 can be prevented. In addition, negative effects on the second high-K gate dielectric layer 181 from high-temperature annealing process during the formation of source regions and drain regions can be avoided.

The second high-K gate dielectric layer 181 can be made of hafnium oxide, zirconium oxide, lanthanum oxide, titanium oxide, tantalum oxide, aluminum oxide, hafnium silicate, zirconium silicate, barium strontium titanium oxide, barium titanium oxide, strontium titanium oxide or a combination thereof. The material of the second high-K gate dielectric layer 181 can be the same as or different from the material of the first high-K gate dielectric layer 171.

In some embodiments, a pad oxide layer (not shown) can be formed on the bottom of the second trench 180. Next, the second high-K gate dielectric layer 181 can be formed on the sidewall of the second trench 180 and the surface of the pad oxide layer (not shown). In other embodiments, the gate oxide layer may be removed in previous etching processes, so the second high-K gate dielectric material layer 181 can be formed directly on the inner wall of the second trench 180.

In one embodiment, the second metal gate electrode 182 can be a multi-layer stacking structure, including: a second work function layer 182a formed on the surface of the second high-K gate dielectric layer 181; and a second metal layer 182b formed on the surface of the second work function layer 182a.

The second work function layer 182a can be made of titanium, tantalum, cobalt, ruthenium, lanthanum, titanium nitride, tantalum nitride, titanium aluminum nitride, titanium-aluminum-cobalt, copper-manganese, titanium-aluminum, or a combination thereof. The material and thickness of the second work function layer 182a can be adjusted to adjust the work function of the correspondingly formed MOS transistor.

The second metal layer can be made of copper, tungsten, aluminum, silver, and/or gold. The material of the second metal layer and the material of the first metal layer can be the same or different. When the formed transistor is a PMOS transistor, the corresponding work function layer may have a high work function. When the formed transistor is an NMOS transistor, the corresponding work function layer may have a low work function. Therefore, the first metal gate and the second metal gate should be formed separately. The material and thickness of the first work function layer 172a of the first metal gate can be different from the material and thickness of the second work function layer 182a of the second metal gate, so the work function of the first metal gate and the work function of the second metal gate can be different.

Because the boundary between the first trench 170 and the second trench 180 can be located on the surface of the STI structure 130, the boundary between the first metal gate 175 and the second metal gate 185 (e.g., between the first high-K gate dielectric layer 171 and the second high-K gate dielectric layer 181) can also be located on the surface of the STI structure 130. Further, because the first high-K gate dielectric layer 171 is formed on the sidewall of the first trench 170, and the second high-K gate dielectric layer 181 is formed on the sidewall of the second trench 180, the first metal gate electrode 172 and the second metal gate electrode 182 can be separated by the first high-K gate dielectric layer 171 and the second high-K gate dielectric layer 181. Because the resistivity of the materials of the first high-K gate dielectric layer 171 and the second high-K gate dielectric layer 181 can be much greater than the resistivity of the materials of the first metal gate electrode 172 and second metal gate electrode 182, the total resistance of the first metal gate 175 and the second metal gate 185 can be large.

Further, due to cost and process considerations, for the common gate which is connected to both the gate of the NMOS transistor and the gate of the PMOS transistor, only one conductive plug is formed on either the first metal gate or the second metal gate. The conductive plug can be used to connect the gate of the NMOS transistor and the gate of the PMOS transistor to an external circuit. But because the resistance of the first high-K gate dielectric layer 171 and the second high-K gate dielectric layer 181 between the first metal gate electrode 172 and the second metal gate electrode 182 can be large, the voltages applied to the first metal gate 175 and the second metal gate 185 can be different, which can cause electrical parameters of the IC device to shift, thus affecting the stability of the IC device.

Figure 14:
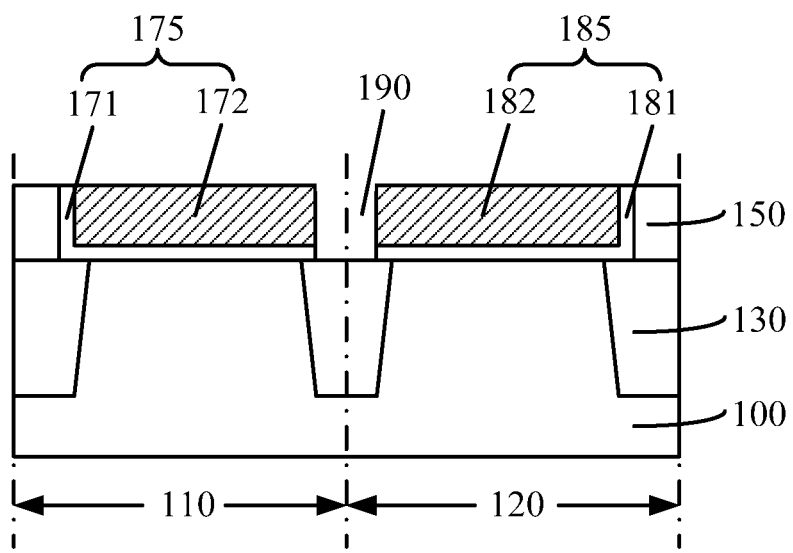

Referring to FIG. 14, a portion of the first metal gate 175 and a portion of the second metal gate 185 at the boundary between the first metal gate 175 and the second metal gate 185 are etched to form a third trench 190.

In one embodiment, the process for forming the third trench 190 can include: forming a third mask layer (not shown) on the surface of the interlayer dielectric layer 150, on a portion of the first metal gate 175, and on a portion of the second metal gate 185. The third mask layer exposes the portion of the first metal gate 175 and the portion of the second metal gate 185 at the boundary between the first metal gate 175 and the second metal gate 185. The third mask layer can expose the boundary between the first metal gate 175 and the second metal gate 185. The third mask layer can be used as a mask to etch the exposed portion of each of the first high-K gate dielectric layer 171, the second high-K gate dielectric layer 181, the first metal gate electrodes 172 and the second metal gate electrode 182, to form a third trench 190.

The third trench 190 can expose the surface of the STI structure 130. One sidewall of the third trench 190 can be the first metal gate electrode 172, and the other sidewall of the third trench 190 can be the second metal gate electrode 182.

The etching gas for etching the first metal gate 175 and the second metal gate 185 can include $Cl_2$, $BCl_3$, and/or $NF_3$. Because of high selectivity ratio of the etching gas, the etching of the first metal gate 175 and the second metal gate 185 does not cause damage to the exposed interlayer dielectric layer 150.

Because the resistance of the first high-K gate dielectric layer 171 and the second high-K gate dielectric layer 181 between the first metal gate electrode 172 and the second metal gate electrode 182 can be large, the electrical characteristics of the IC device can be affected. Therefore, the first high-K gate dielectric layer 171 and the second high-K gate dielectric layer 181 between the first metal gate electrode 172 and the second metal gate electrode 182 can be removed by etching. Further, a conductive material layer can be formed in the third groove 190, so that the first metal gate electrode 172 and the second metal gate electrode 182 can be electrically connected by the conductive material layer. As a result, the total resistance of the first metal gate 175 and the second metal gate 185 can be reduced. Thus, the gate voltages of the NMOS transistor and the PMOS transistor of the common gate can be the same.

In some embodiments, the depth of the third trench 190 can be equal to the height of each of the first metal gate 175 and the second metal gate 185. The third trench 190 can expose the surface of the STI structure 130. When the depth of the third trench 190 is greater, the cross-sectional area of the subsequently-formed conductive material layer can be larger, the resistance of the conductive material layer can be the smaller, and the gate voltages of the NMOS transistor the PMOS transistor of the common gate can be the more equal.

Furthermore, the width of the third groove 190 can be greater than the total thickness of the first high-K gate dielectric layer 171 and the second high-K gate dielectric layer 181. So the first high-K gate dielectric layer 171 and the second high-K gate dielectric layer 181 between the first metal gate electrode 172 and the second metal gate electrode 182 can be completely removed. In order not to affect the normal operation of the first metal gate 175 and the second metal gate 185, the width of the third trench 190 can be less than the width of the STI structure 130. At the bottom of the third trench 190, only the surface of the STI structure of 130 can be exposed, which can avoid electrical connection between the subsequently-formed conductive material layer and the semiconductor substrate 100 that may result in short-circuit between the gate and the source and/or drain.

In other embodiments, the depth of the third trench 190 can be less than the height of each of the first metal gate 175 and the second metal gate 185, so that the third trench 190 cannot expose the surface of the STI structure 130 or the semiconductor substrate 100.

Furthermore, the width of the third groove 190 can be at least greater than the total thickness of the first high-K gate dielectric layer 171 and the second high-K gate dielectric layer 181. So the first high-K gate dielectric layer 171 and the second high-K gate dielectric layer 181 between the first metal gate electrode 172 and the second metal gate electrode 182 can be partially removed. After the conductive material layer is subsequently formed, the first metal gate electrode 172 and the second metal gate electrode 182 can be electrically connected by the conductive material layer. In addition, the width of the third groove 190 can be less than, equal to or greater than the width of the STI structure 130. As a result, not only the requirements for alignment accuracy can be lowered, but also the aspect ratio of the third groove 190 can be reduced. Thus, process requirements and process difficulty can be reduced.

In other embodiments, when the depth of the third trench 190 is less than the height of each of the first metal gate 175 and the second metal gate 185, the third mask layer does not need to be formed. A thickness portion of the first metal gate 175 and the second metal gate 185 can be removed using a dry etching process or a wet etching process to form the third trench 190. As a result, the width of the third trench 190 can be equal to the total length of the first metal gate 175 and the second metal gate 185. After the conductive material layer is subsequently formed, the partially-removed first metal gate 175 and second metal gate 185 can be electrically connected by the conductive material layer. Thus, process steps can be reduced. In other embodiments, the width of the third groove 190 can range from about 30 nm to about 60 nm.

Figure 15A:
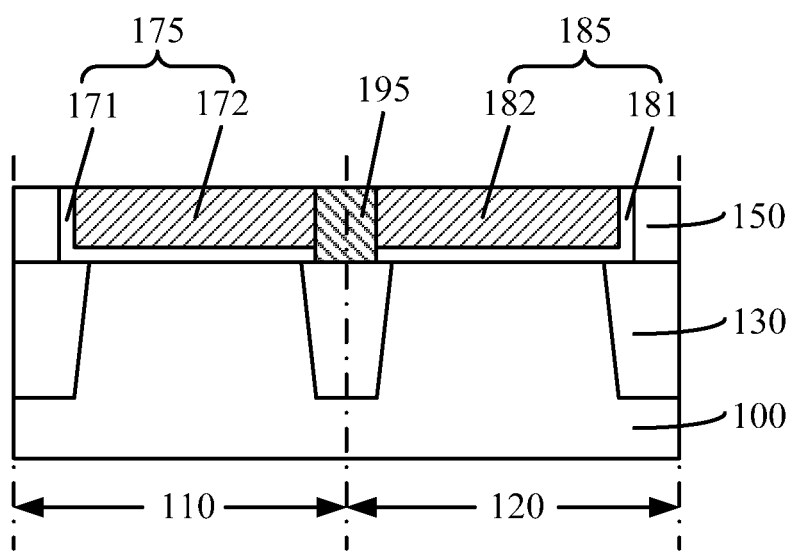
Figure 15B:
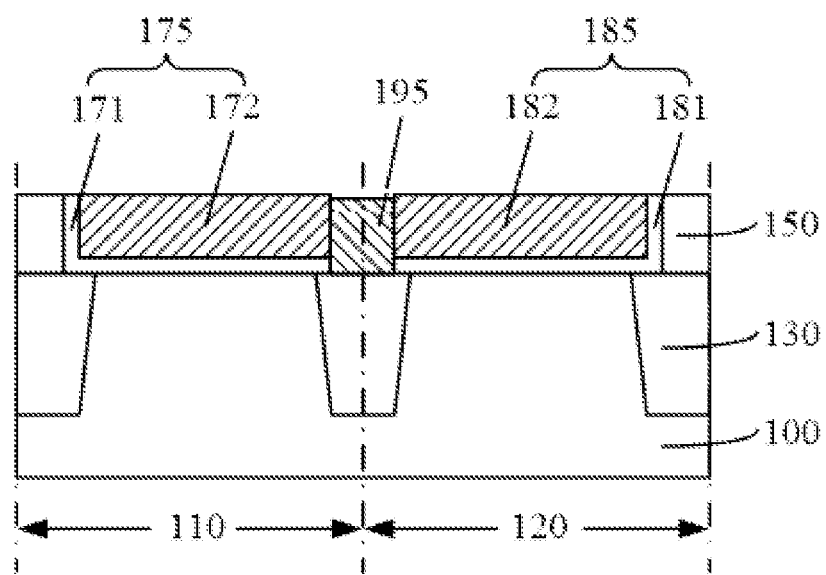

Referring to FIG. 15, a conductive material layer 195 is formed in the third trench 190. The conductive material layer 195 can be made of polysilicon, aluminum, copper, silver, gold, and/or tungsten. For example, the conductive material layer 195 can be aluminum. The process for forming the conductive material layer 195 can include: for example, forming an aluminum material on the third trench 190 and the interlayer dielectric layer 150 to fill the third trench 190; and polishing the aluminum material using a CMP process, until the interlayer dielectric layer 150 is exposed. The aluminum material in the third trench 190 can form the conductive material layer 195. The top surfaces of the conductive material layer 195, the first metal gate 175, and the second metal gate 185 can be leveled with the top surface of the interlayer dielectric layer 150.

One sidewall of the third trench 190 can be the first metal gate electrode 172, and the other sidewall of the third trench 190 can be the second metal gate electrode 182. Therefore, one end of the conductive material layer 195 can be connected to the first metal gate electrode 172, and the other end of the conductive material layer 195 can be connected to the second metal gate electrode 182. Because the resistance of the conductive material layer 195 can be much lower than the resistance of the first high-K gate dielectric layer 171 and the second high-K gate dielectric layer 181, the gate voltages of the NMOS transistor and the PMOS transistor of the finally-formed common gate can be the same.

In a certain embodiment, an exemplary method is provided for forming a semiconductor structure having a common gate in a 28 nm high-K last gate last process. During an exemplary process, a dummy structure is formed, followed by formation of source/drain regions (including, e.g., nickel silicide). Optionally, a single layer tensile contact etch stop layer (CESL) can be deposited. An interlayer dielectric layer (e.g., TEOS) can be deposited using a CMP process. Next, a portion of the dummy gate structure can be removed to form a first trench in the first transistor region. A first metal gate can be formed in the first trench. The remaining portion of the dummy gate structure can be removed to form a second trench in the second transistor region. A second metal gate can be formed in the second trench. Thus, robust tuning of work functions of each of the metal gates and a large gap fill process window can be achieved. Further, a portion of the first metal gate and a portion of the second metal gate can be etched to form a third trench (using e.g. a dry etching process), such that a first high-K gate dielectric layer and a second high-K gate dielectric layer at the boundary between the first metal gate and the second metal gate can be removed. A conductive material layer (e.g. aluminum) can be formed in the third trench to decrease the resistance of the common gate.

A semiconductor structure having a common gate is provided using the method in accordance with various disclosed embodiments. Referring to FIG. 15, the semiconductor structure can include: a semiconductor substrate 100, an interlayer dielectric layer 150, a first metal gate 175, a second metal gate 185, and/or a conductive material layer 195.

The semiconductor substrate 100 can have a first transistor region 110 and a second transistor region 120. An STI structure 130 can be formed between the first transistor region 110 and the second transistor region 120. The interlayer dielectric layer 150 can be formed on the semiconductor substrate 100 and can have the first trench 170 and the second trench 180. The first metal gate 175 can be located in the first trench 170 and the second metal gate 185 located in the second trench 180. The first metal gate 175 can correspond to the first transistor region 110 and the second metal gate 185 can correspond to the second transistor region 120. An end of the first metal gate 175 can be in connection with an end of the second metal gate 185. The boundary between the first metal gate 175 and the second metal gate 185 can be located on the STI structure 130. The first metal gate 175 can include a first high-K gate dielectric layer 171 formed on the inner wall of the first trench 170 and a first metal gate electrode 172 formed on the first high-K gate dielectric layer 171. The second metal gate 185 can include the second high-K gate dielectric layer 181 formed on the inner wall of the second trench 180 and the second metal gate electrode 182 formed on the second high-K gate dielectric layer 181. The conductive material layer 195 can be located at the boundary between the first metal gate 175 and the second metal gate 185 and within the first metal gate 175 and the second metal gate 185. The top surfaces of the conductive material layer 195, the first metal gate 175, and the second metal gate 185 can be leveled with the top surface of the interlayer dielectric layer 150.

In some embodiments, the height of the conductive material layer 195 can be equal to the height of each of the first metal gate 175 and the second metal gate 185. The width of the conductive material layer 195 can be greater than the total thickness of the first high-K gate dielectric layer 171 and the second high-K gate dielectric layer 181, and less than the width of the STI structure 130. So the conductive material layer 195 can be entirely located on the STI structure 130. The width of the conductive material layer 195 can range from about 30 nm to about 60 nm. One sidewall of the third trench 190 can be the first metal gate electrode 172, and the other sidewall of the third trench 190 can be the second metal gate electrode 182. In addition, the resistance of the conductive material layer 195 can be much lower than the resistance of the first high-K gate dielectric layer 171 and the second high-K gate dielectric layer 181. As a result, the gate voltages of the NMOS transistor and the PMOS transistor of the finally-formed common gate can be the same.

In other embodiments, the height of the conductive material layer 195 can be less than the height of each of the first metal gate 175 and the second metal gate 185. Furthermore, the width of the conductive material layer 195 can be at least greater than the total thickness of the first high-K gate dielectric layer 171 and the second high-K gate dielectric layer 181. Thus, one end of the conductive material layer 195 can be connected to the first metal gate electrode 172, and the other end of the conductive material layer 195 can be connected to the second metal gate electrode 182.

In this manner, various disclosed embodiments provide a semiconductor structure having a common gate. The semiconductor structure can include a conductive material layer formed at least at the boundary where a first metal gate is connected with a second metal gate. One end of the conductive material layer can be connected to a first metal gate electrode, and the other end of the conductive material layer can be connected to a second metal gate electrode. Thus, the resistance between the first metal gate electrode and the second metal gate electrode can be effectively reduced. As a result, gate voltages of the NMOS transistor and the PMOS transistor of the common gate can be essentially the same.

Furthermore, the first high-K gate dielectric layer can be formed during the formation of the first metal gate, and the second high-K gate dielectric layer can be formed during the formation of the second metal gate. As a result, when the dummy gate structure is removed, damage to the first high-K gate dielectric layer and the second high-K gate dielectric layer can be prevented. As a result, the amount of defects in the first high-K gate dielectric layer and the second high-K gate dielectric layer can be reduced. Thus, the quality and stability of the first high-K gate dielectric layer and the second high-K gate dielectric layer can be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor structure having a common gate, comprising:
    a semiconductor substrate having a first transistor region, a second transistor region, and an isolation structure in the semiconductor substrate between the first transistor region and the second transistor region;
    an interlayer dielectric layer disposed on the semiconductor substrate, wherein the interlayer dielectric layer includes a first trench in the first transistor region and a second trench in the second transistor region;
    a first metal gate disposed in the first trench, wherein the first metal gate includes a first high-K gate dielectric layer disposed on a bottom and a sidewall of the first trench and a first metal gate electrode disposed on the first high-K gate dielectric layer;
    a second metal gate disposed in the second trench, wherein the second metal gate includes a second high-K gate dielectric layer disposed on a bottom and a sidewall of the second trench and a second metal gate electrode disposed on the second high-K gate dielectric layer, a top surface of the interlayer dielectric layer coplanar with a top surface of the first metal gate and a top surface of the second metal gate; and
    a conductive material layer disposed on and directly contacting a surface of the isolation structure in the semiconductor substrate, and at a boundary between the first metal gate and the second metal gate, wherein
        a sidewall portion of the conductive material layer physically connects to each of the first high-K gate dielectric layer of the first metal gate and the second high-K gate dielectric layer of the second metal gate;
        a height of the conductive material layer is equal to a height of each of the first metal gate and the second metal gate; and
        a top surface of the conductive material layer is coplanar with the top surface of the first metal gate and the top surface of the second metal gate.

2. The semiconductor structure of claim 1, wherein, when the height of the conductive material layer is equal to the height of each of the first metal gate and the second metal gate, a width of the conductive material layer is less than a width of the isolation structure and greater than a total thickness of the first high-K gate dielectric layer and the second high-K gate dielectric layer.

3. The semiconductor structure of claim 1, wherein when the height of the conductive material layer is less than the height of each of the first metal gate and the second metal gate, a width of the conductive material layer is greater than a total thickness of the first high-K gate dielectric layer and the second high-K gate dielectric layer.

4. The semiconductor structure of claim 3, wherein the width of the conductive material layer is equal to a total length of the first metal gate and the second metal gate.

5. The semiconductor structure of claim 1, wherein the conductive material layer has a width ranging from about 30 nm to about 60 nm.

6. The semiconductor structure of claim 1, wherein the conductive material layer is made of a material including polysilicon, aluminum, copper, silver, gold, tungsten, or a combination thereof.

7. The semiconductor structure of claim 1, further including source regions and drain regions disposed in the semiconductor substrate at both sides of each of the first metal gate and the second metal gate.

8. The semiconductor structure of claim 1, wherein one of the first transistor region and the second transistor region is an NMOS transistor region and an other of the first transistor region and the second transistor region is a PMOS transistor region.

9. The semiconductor structure of claim 1, wherein each of the first metal gate electrode and the second metal gate electrode includes a multi-layer stacking structure, and wherein the first metal gate electrode includes a first work function layer and a first metal layer on the first work function layer; the second metal gate electrode includes a second work function layer and a second metal layer on the second work function layer; and the first work function layer of the first metal gate electrode and the second work function layer of the second metal layer have different materials or different thicknesses.

10. The semiconductor structure of claim 1, wherein the conductive material layer physically connects each of the first metal gate electrode of the first metal gate and the second metal gate electrode of the second metal gate.

11. A semiconductor structure having a common gate, comprising:
   a semiconductor substrate having a first transistor region, a second transistor region, and an isolation structure in the semiconductor substrate between the first transistor region and the second transistor region;
   an interlayer dielectric layer disposed on the semiconductor substrate, wherein the interlayer dielectric layer includes a first trench in the first transistor region and a second trench in the second transistor region;
   a first metal gate disposed in the first trench, wherein the first metal gate includes a first high-K gate dielectric layer disposed on a bottom and a sidewall of the first trench and a first metal gate electrode disposed on the first high-K gate dielectric layer;
   a second metal gate disposed in the second trench, wherein the second metal gate includes a second high-K gate dielectric layer disposed on a bottom and a sidewall of the second trench and a second metal gate electrode disposed on the second high-K gate dielectric layer, a top surface of the interlayer dielectric layer coplanar with a top surface of the first metal gate and a top surface of the second metal gate; and
   a conductive material layer disposed over and directly contacting a surface of the isolation structure in the semiconductor substrate and at a boundary between the first metal gate and the second metal gate to connect the first metal gate electrode with the second metal gate electrode, wherein
   a height of the conductive material layer is less than a height of each of the first metal gate and the second metal gate; and
   a top surface of the conductive material layer is coplanar with the top surface of the first metal gate and the top surface of the second metal gate.

12. The semiconductor structure of claim 11, wherein a width of the conductive material layer is greater than a total thickness of the first high-K gate dielectric layer and the second high-K gate dielectric layer.

13. The semiconductor structure of claim 12, wherein the width of the conductive material layer is equal to a total length of the first metal gate and the second metal gate.

14. The semiconductor structure of claim 11, wherein the conductive material layer has a width ranging from about 30 nm to about 60 nm.

15. The semiconductor structure of claim 11, wherein the conductive material layer is made of a material including polysilicon, aluminum, copper, silver, gold, tungsten, or a combination thereof.

16. The semiconductor structure of claim 11, further including source regions and drain regions disposed in the semiconductor substrate at both sides of each of the first metal gate and the second metal gate.

17. The semiconductor structure of claim 11, wherein one of the first transistor region and the second transistor region is an NMOS transistor region and an other of the first transistor region and the second transistor region is a PMOS transistor region.

18. The semiconductor structure of claim 11, wherein each of the first metal gate electrode and the second metal gate electrode includes a multi-layer stacking structure, and wherein the first metal gate electrode includes a first work function layer and a first metal layer on the first work function layer; the second metal gate electrode includes a second work function layer and a second metal layer on the second work function layer; and the first work function layer of the first metal gate electrode and the second work function layer of the second metal layer have different materials or different thicknesses.

* * * * *